(12) United States Patent
Kawata et al.

(10) Patent No.: US 11,067,230 B2
(45) Date of Patent: Jul. 20, 2021

(54) LIGHTING DEVICE

(71) Applicants: FKK Corporation, Kyoto (JP); Shenzhen XLX Light Sources Co. Ltd., Shenzhen (CN)

(72) Inventors: Kazuo Kawata, Kyoto (JP); Kazuki Yoshida, Kyoto (JP)

(73) Assignees: SHENZHEN XLX LIGHT SOURCES CO. LTD., Shenzhen (CN); FKK CORPORATION, Kyoto (JP)

( * ) Notice: Subject to any disclaimer, the term of this patent is extended or adjusted under 35 U.S.C. 154(b) by 0 days.

(21) Appl. No.: 16/776,232

(22) Filed: Jan. 29, 2020

(65) Prior Publication Data

US 2020/0263845 A1 Aug. 20, 2020

(30) Foreign Application Priority Data

Feb. 19, 2019 (JP) .............................. JP2019-027103

(51) Int. Cl.
*F21S 4/22* (2016.01)
*F21S 4/28* (2016.01)
(Continued)

(52) U.S. Cl.
CPC . *F21S 4/22* (2016.01); *F21S 4/28* (2016.01); *F21V 3/02* (2013.01); *H05K 1/189* (2013.01);
(Continued)

(58) Field of Classification Search
CPC ............... F21S 4/22; F21S 4/28; H05K 1/189
(Continued)

(56) References Cited

U.S. PATENT DOCUMENTS 4,546,416 A * 10/1985 Pemberton ................ F21V 9/32
362/84
2005/0041424 A1* 2/2005 Ducharme ................ F21V 9/32
362/231
(Continued)

FOREIGN PATENT DOCUMENTS

CN 203348949 U 12/2013
CN 207349855 U 5/2018
(Continued)

OTHER PUBLICATIONS

Extended European Search Report, dated Apr. 30, 2020, for European Patent Application No. 20151746.3.
(Continued)

*Primary Examiner* — Bryon T Gyllstrom
(74) *Attorney, Agent, or Firm* — K&L Gates LLP; Louis C. Cullman; Georgia N. Kefallinos

(57) ABSTRACT

A lighting device 1 includes a circuit board that is long and flexible, light emitters mounted in a row on the circuit board, and an elongated cover. The cover includes (i) a translucent member that is made of translucent soft material and that covers the circuit board and the light emitters, and (ii) a phosphorescent member containing a phosphorescent material that is to be excited by light emitted by the light emitters. The phosphorescent member is arranged on a second area portion of the cover other than a first area portion of the cover that is located in an emission direction of light from each of the light emitters and a luminous intensity is equal to or greater than a standard luminous intensity in the emission direction.

4 Claims, 3 Drawing Sheets

(51) Int. Cl.
*F21V 3/02* (2006.01)
*H05K 1/18* (2006.01)
*F21Y 115/10* (2016.01)

(52) U.S. Cl.
CPC ....... *F21Y 2115/10* (2016.08); *H05K 2201/05* (2013.01); *H05K 2201/10106* (2013.01)

(58) Field of Classification Search
USPC .................................................. 362/249.04
See application file for complete search history.

(56) References Cited

U.S. PATENT DOCUMENTS

| | | | |
|---|---|---|---|
| 2006/0198119 A1* | 9/2006 | Hulse | G02B 19/0066 362/84 |
| 2010/0321921 A1 | 12/2010 | Ivey | |
| 2013/0271971 A1 | 10/2013 | Uemura et al. | |
| 2014/0036500 A1 | 2/2014 | Eggleton et al. | |
| 2014/0140061 A1 | 5/2014 | Sundholm | |
| 2019/0067533 A1* | 2/2019 | Chen | H01L 33/54 |

FOREIGN PATENT DOCUMENTS

| | | |
|---|---|---|
| JP | 2005-115189 A | 4/2005 |
| JP | 2007-150271 A | 6/2007 |
| JP | 2015-133221 A | 7/2015 |
| JP | 2018-078044 A | 5/2018 |
| RU | 75002 U1 | 7/2008 |
| RU | 123230 U1 | 12/2012 |
| WO | 2012/043543 A1 | 4/2012 |
| WO | 2012/143611 A1 | 10/2012 |
| WO | 2013/007875 A1 | 1/2013 |
| WO | 2014/067241 A1 | 5/2014 |

OTHER PUBLICATIONS

English Translation of Russian Search Report for Russian Patent Application Serial No. 2020104036 filed Jan. 30, 2020 (original also enclosed).

English Translation of Russian Office Action, dated Mar. 23, 2020, for Russian Patent Application Serial No. 2020104036 filed Jan. 30, 2020 (original enclosed also).

Office Action dated Aug. 13, 2020, issued for the corresponding Korean patent application No. 10-2019-0044096 (Original and translation included).

* cited by examiner

LIGHTING DEVICE

CROSS-REFERENCE TO RELATED APPLICATION

This application claims the benefit of Japanese Patent Application No. 2019-027103, filed on Feb. 19, 2019, the entire disclosure of which is incorporated by reference herein.

FIELD

This application relates to a lighting device.

BACKGROUND

A flexible light emitting device is proposed which includes: an elongated flexible circuit board on which light-emitting elements are mounted in line; and an elongated hollow tube made of translucent soft resin to be shaped into a square tube, and the flexible circuit board is inserted into an inner space of the hollow tube (for example, refer to Unexamined Japanese Patent Application Kokai Publication No. 2007-150271).

Examples of the use of an elongated flexible lighting device include the use of the elongated flexible lighting device as a direction indicator lamp by laying the elongated flexible lighting device along a path in a building. However, the flexible light emitting device disclosed in Unexamined Japanese Patent Application Kokai Publication No. 2007-150271 may be unable to fulfil a function as a direction indicator lamp power since electric power ceases to be supplied to the light-emitting elements when a blackout occurs during a disaster.

In consideration of the aforementioned circumstances, and an objective of the present disclosure is to provide a lighting device that can fulfil a function as a direction indicator lamp during a blackout.

SUMMARY

In order to attain the aforementioned objective, a lighting device according to the present disclosure includes (i) a circuit board that is and flexible, (ii) light emitters mounted in a row on the circuit board, and (iii) a cover that is long and includes: a translucent member that is made of a translucent soft material and covers the circuit board and the light emitters; and a phosphorescent member containing a phosphorescent material that is to be excited by light emitted by the light emitters.

Advantageous Effect of the Invention

According to the present disclosure, the cover includes the phosphorescent member containing the phosphorescent material that is to be excited by light emitted by the light emitters. Accordingly, the phosphorescent material contained in the phosphorescent member is excited by light emitted by the light emitters while the lighting device is on. As a result, for example, even after the supply of electric power to the light emitters ceases due to the occurrence of a blackout during the light emission by the lighting device, light is emitted by the phosphorescent material that was excited while the lighting device was on, and thus the lighting device continues to emit light. Accordingly, the lighting device according to the present disclosure has the advantage of fulfilling a function as a direction indicator lamp even in a situation where the supply of electric power to the light emitters ceases due to the occurrence of a blackout.

BRIEF DESCRIPTION OF THE DRAWINGS

A more complete understanding of this application can be obtained when the following detailed description is considered in conjunction with the following drawings, in which.

DETAILED DESCRIPTION

Figure 1A:
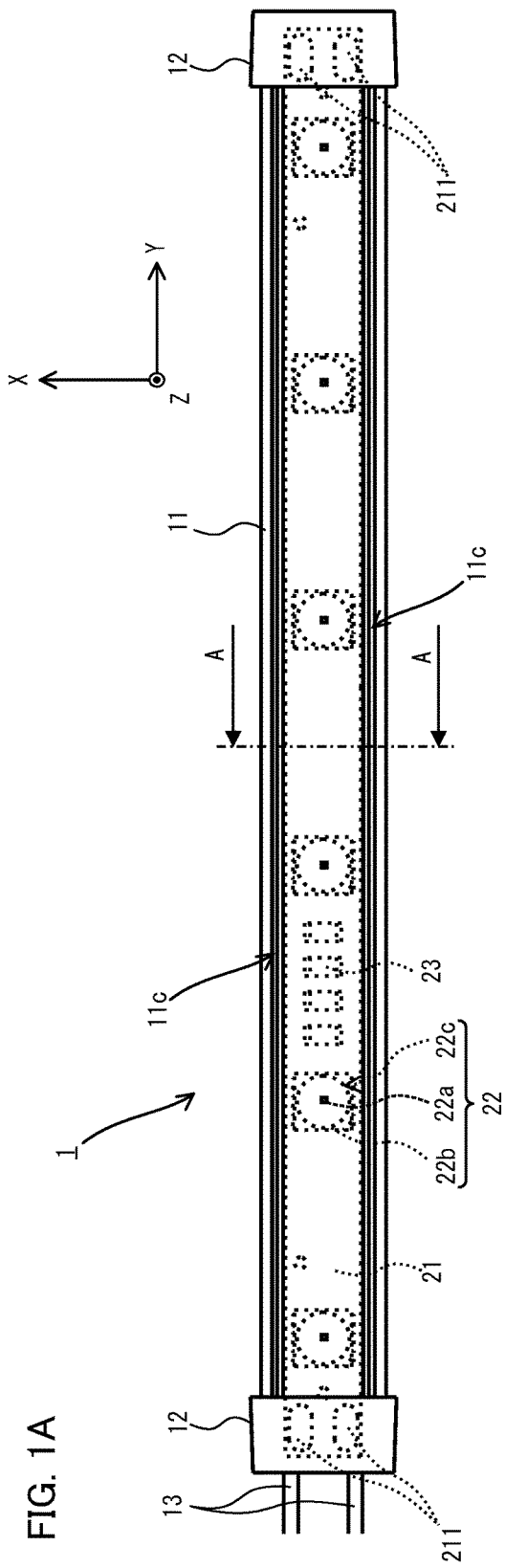
FIG. 1A is a plan view illustrating a lighting device according to an embodiment of the present disclosure and FIG. 1B is a perspective view illustrating the lighting device.
Figure 1B:
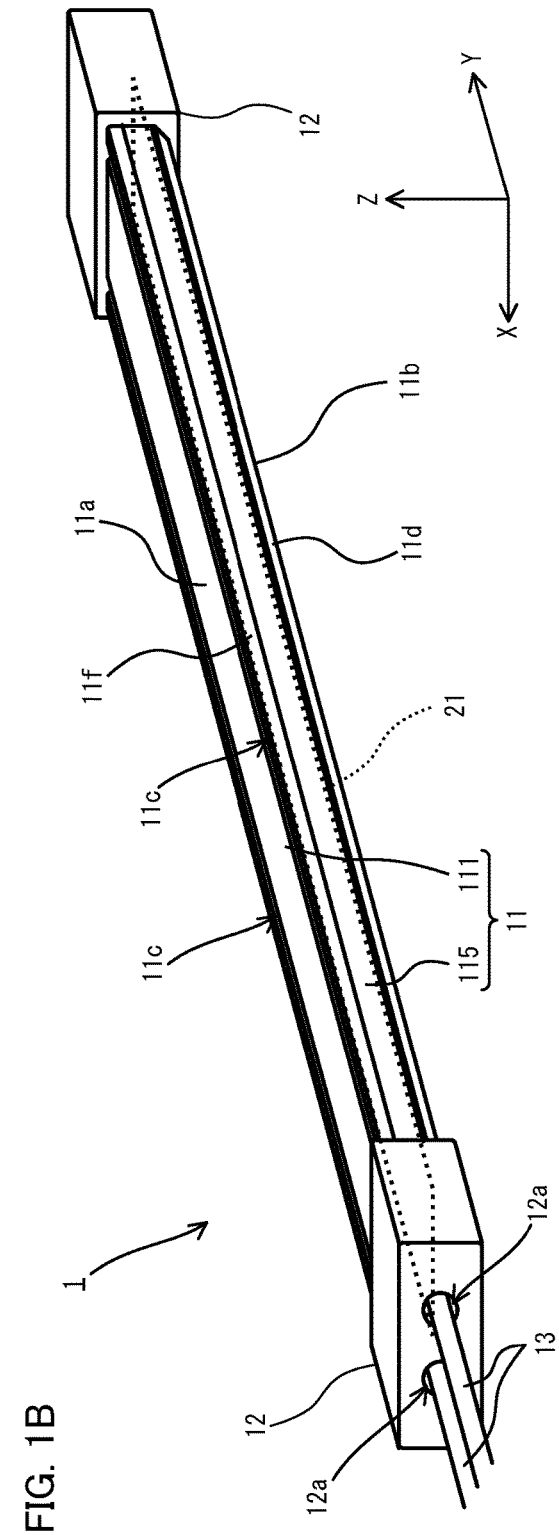

A lighting device according to an embodiment of the present disclosure is described below with reference to the drawings. As illustrated in FIGS. 1A and 1B, a lighting device 1 includes a flexible long circuit board 21, light emitters 22, a current limiting element 23 to limit a current supplied to the light emitters 22, and a flexible long cover 11. Additionally, the lighting device 1 includes a conductive wire 13 for supplying the current to the light emitters 22, and caps 12 mounted on both end portions of the cover 11 in a longitudinal direction of the cover 11 to seal an interior of the cover 11. The lighting device 1 is connected, via the conductive wire 13, to a direct-current (DC) power source not illustrated in the drawings.

The circuit board 21 includes, for example, flexible printed circuits (FPC) and a conductor pattern not illustrated in the drawings is formed on the circuit board. Additionally, electrodes 211 electrically connected to the conductive wire 13 are disposed at the both ends of the circuit board 21 in the longitudinal direction of the circuit board 21.

Each of the light emitters 22 is, for example, a surface mount device (SMD)-type light emitting diode (LED) device. Each of the light emitters 22 includes (i) a rectangular plate-shaped body 22b having a concave portion 22c that is formed on one surface of the body 22b in a thickness direction and has a shape like a circle when the concave portion is viewed in a plan view, (ii) a light emitting element 22a disposed on the bottom of the concave portion 22c, and (iii) a color conversion member with which the concave portion 22c is filled, and the color conversion member is not illustrated in the drawings. For example, an LED element to emit light in a blue wavelength range or an ultraviolet wavelength range is used as the light emitting element 22a. The light emitters 22 are mounted on a first main surface 21b of the circuit board 21 equally spaced relative to one another in a row (refer to FIG. 2). The light emitting elements 22a of the light emitters 22 are connected to one another in series or in parallel via the conductive pattern formed on the circuit board 21. The current limiting element 23 is incorporated into the conductive pattern formed on the circuit board 21 to limit, to a preset quantity, a current flowing through the light emitting elements 22a. When current from the DC power source flows through the light emitting elements 22a via the conductive wire 13 and the conductive pattern, the light emitting elements 22a emit light.

Figure 2:
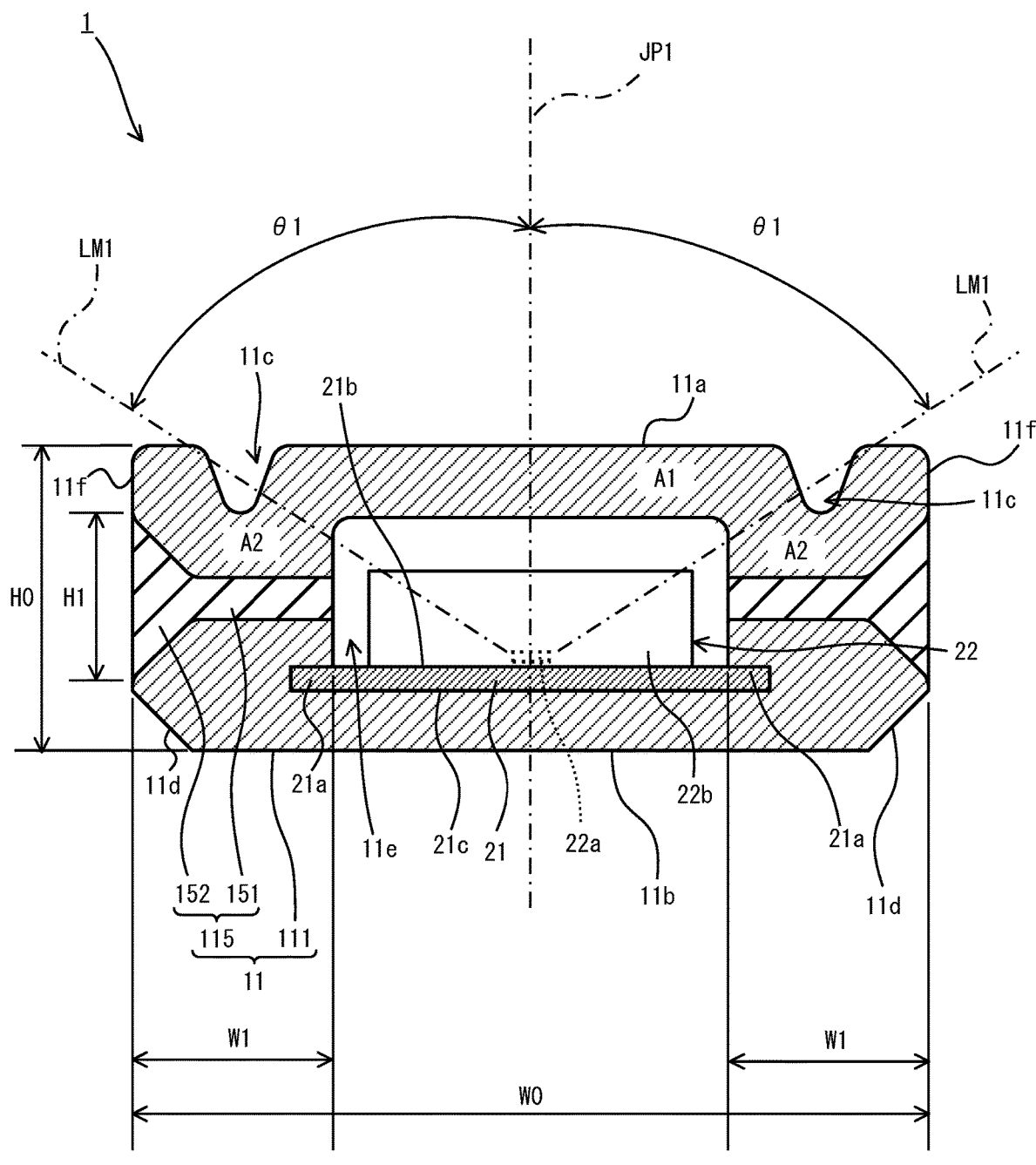
FIG. 2 is a cross-sectional view illustrating the lighting device according to the embodiment and is taken along an A-A line in FIG. 1A.
Figure 2:
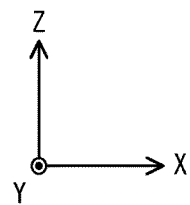

As illustrated in FIGS. 1B and 2, the cover 11 includes (i) a translucent member 111 that is made of translucent soft material and covers the circuit board 21 and the light emitters 22, and (ii) a phosphorescent member 115 containing a phosphorescent material that is to be excited by light emitted by the light emitters 22. Thermo-setting plastic polyurethane resin having translucency, silicone resin having translucency or the like may be used as the translucent soft material. The cover 11 is shaped like a square tube. As illustrated in FIG. 2, the cover 11 includes (i) a flat light exit surface 11a through which the light emitted by the light emitters 22 mounted on the circuit board 21 is emitted, and (ii) a flat rear surface 11b opposite to the light exit surface 11a. The circuit board 21 and the light emitters 22 are disposed on the inside of the cover 11. Both end portions 21a of the circuit board 21 in the widthwise direction are embedded in the cover 11, and the second main surface 21c opposite to the first main surface 21b of the circuit board 21 adheres tightly to the cover 11. Also, the cover 11 has tapered surfaces 11d that are formed at a corner portion of an outer wall of the cover 11 and that extend in the longitudinal direction. The light exit surface 11a of the cover 11 is formed to be a surface of an outer wall of the cover 11 facing the first main surface 21b such that the light exit surface 11a is parallel to the first main surface 21b of the circuit board 21 and extends in the longitudinal direction of the cover 11. Grooves 11c are formed on the light exit surface 11a and extend in the longitudinal direction of the cover 11. The grooves 11c are grooves for decoration. The tapered surfaces 11d incline relative to the first main surface 21b of the circuit board 21 on which the light emitters 22 are mounted.

The phosphorescent member 115 is arranged on a second area portion A2 of the cover 11 other than a first area portion A1 of the cover 11 that is located in such an emission direction of light from each of the light emitters 22 that a luminous intensity is equal to or greater than a standard luminous intensity that is less than a preset maximum luminous intensity. In other words, the phosphorescent member 115 is arranged on the second area portion A2 other than the first area portion A1 through which all of virtual lines of rays emitted by each light emitter 22 extending in the emission direction that results in a luminous intensity equal to or greater than the standard luminous intensity pass. A virtual axis JP1 illustrated in FIG. 2 is parallel to the thickness direction of the circuit board 21 and passes through the central portion of the light emitting element 22a, a cone-shape region illustrated in FIG. 2 has the central portion of the light emitting element 22a as an apex and formed by a generatrix LM1 that is at an angle of $\theta_1$ to the virtual axis JP1, and the first area portion A1 corresponds to an area of the cone-shaped region overlapping with the cover 11. Also, the standard luminous intensity, for example, is set to be a luminous intensity equivalent to one-half of the maximum luminous intensity of light emitted by each of the light emitting elements 22a. In this case, the angle $\theta_1$ is set to be 60 degrees. Also, as illustrated in FIG. 1B, the phosphorescent member 115 is arranged along the entirety of the cover 11 in the longitudinal direction of the cover 11. Additionally, as illustrated in FIG. 2, the phosphorescent member 115 includes a first sub phosphorescent portion 151 and a second sub phosphorescent portion 152. The first sub phosphorescent portion 151 extends in a direction perpendicular to the thickness direction of the circuit board 21, that is, toward an outer lateral surface 11f of the cover 11 in the X-axis direction, and one end of the first sub phosphorescent portion is exposed to an inner space 11e of the cover 11. The second sub phosphorescent portion 152 is continuous with the other end of the first sub phosphorescent portion 151, and the width of the second sub phosphorescent portion 152 in the thickness direction of the circuit board 21 gradually increases toward the outer surface 11f of the cover 11.

In this case, the Z-axis directional width H1 of the portion of the phosphorescent member 115 exposed at the outer surface 11f of the cover 11 is set to be equal to or greater than one-half of the width H0 of the cover 11 in the Z-axis direction. For example, if the width H0 of the cover 11 in the Z-axis direction is 5 mm to 5.6 mm, the Z-axis directional width H1 of the portion of the phosphorescent member 115 exposed at the outer surface 11f of the cover 11 is set to 2.8 mm to 3 mm for example. Additionally, the width W1 of the phosphorescent member 115 in the width direction of the cover 11, that is, in the X-axis direction is set to be equal to 20% or more of the width W0 of the cover 11 in the X-axis direction. For example, if the width W0 of the cover 11 in the X-axis direction is 13 mm to 13.3 mm, the width W1 of the phosphorescent member 115 in the X-axis direction is set to 2.7 mm to 3.5 mm for example.

Also, the phosphorescent member 115 may be a member obtained by dispersing phosphorescent material into a base material made of soft material such as translucent polyurethane resin or silicone resin. In this case, the phosphorescent material used in the embodiment may be, for example, particles of an inorganic compound selected from zinc sulfide, calcium sulfate, zinc oxide, and aluminate having a general formula expressed by $M_{1-X}Al_2O_{4-X}$. The letter "M" included in the general formula denotes at least one metallic element selected from calcium, strontium, and barium. Also, the numerical value denoted by the letter "X" included in the general formula has only to be within the range of −0.33 to 0.60. Also, europium as an activator agent may be added to the phosphorescent member 115, and at least one or more elements as a co-activator agent may be selected from neodymium, samarium, dysprosium, holmium, erbium, thulium, ytterbium, and lutetium, and the elements selected as the co-activator agent may be added to the phosphorescent member 115. Although the average diameter of the particles used as the phosphorescent material is not limited to any particular range, the average diameter preferably is, for example, 1 μm to 500 μm.

The caps 12 are made of translucent resin material and each have a shape like a bottomed square tube. Each of the caps 12 has an outlet hole 12a that is used for pulling out the conductive wire 13 and that is formed on a bottom wall of each cap 12. The size of the inside cross-sectional surface of each of the caps 12 is greater than the outer sizes of the cross-sectional surfaces of the cover 11, and the caps 12 are attached to the cover 11 to cover the both ends of the cover 11 in the longitudinal direction of the cover 11.

As described above, in the lighting device 1 according to the present embodiment, the cover 11 includes the phosphorescent member 115 containing the phosphorescent material to be excited by light emitted by the light emitters 22. As a result, while the lighting device 1 is on, the phosphorescent material contained in the phosphorescent member 115 is excited by light emitted by the light emitters 22. As a result, for example, even after the supply of electric power to the light emitters 22 ceases due to the occurrence of a blackout during the light emission by the lighting device 1, light is emitted by the phosphorescent material that was excited while the lighting device 1 was on, and thus the lighting device 1 continues to emit light. Accordingly, the lighting device 1 according to the present disclosure has the advantage of fulfilling a function as a direction indicator lamp even in a situation where the supply of electric power to the light emitters 22 ceases due to the occurrence of a blackout.

Also, the phosphorescent member 115 of the present embodiment is arranged on the second area portion A2 of the cover 11 excluding the first area portion A1 of the cover 11 that is located in such an emission direction of light from each of the light emitters 22 that the luminous intensity is equal to or greater than the standard luminous intensity. Accordingly, excessive absorption of light from the light emitters 22 by the phosphorescent member 115 can be suppressed, thereby enabling an increase in the efficiency of the use of light emitted by the light emitters 22.

Additionally, the phosphorescent member 115 of the present embodiment is arranged along the entirety of the cover 11 in the longitudinal direction of the cover 11. As a result, in a case in which the lighting device 1 is arranged along a path in a building for example, the entirety of the path can be illuminated by light emitted by the phosphorescent member 115 during a blackout.

Also, the phosphorescent member 115 of the present embodiment includes the first sub phosphorescent portion 151 and the second sub phosphorescent portion 152 that is continuous with the other end of the first sub phosphorescent portion 151 and that has a width in the thickness direction of the circuit board 21 gradually increasing toward the outer wall of the cover 11. As a result, a portion of the second sub phosphorescent portion 152 exposed to the outside on the outer wall side of the cover 11 can have a large area, thereby enabling efficient emission of light to the outside of the cover 11 by the phosphorescent member 115.

Figure 3:
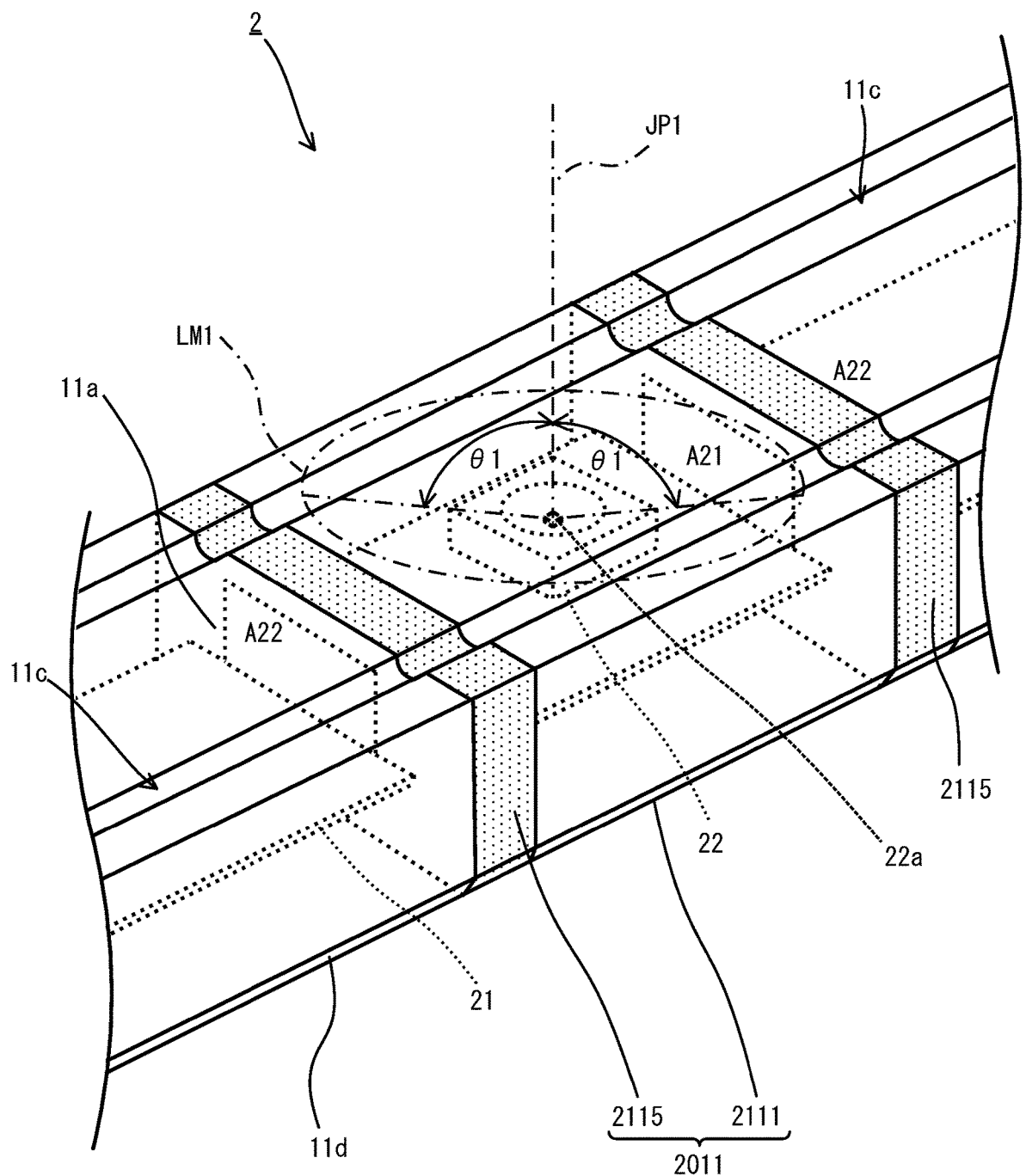
FIG. 3 is a perspective view illustrating a portion of a lighting device according to a modified example of the present disclosure.

Although the present embodiment is described above, the present disclosure is not limited to the present embodiment. For example, as in a lighting device 2 illustrated in FIG. 3, the lighting device may include: phosphorescent members 2115 disposed on the both sides of a cover 2011 in the longitudinal direction of the cover 2011 in each of the light emitters 22, that is, in the Y-axis direction; and a translucent member 2111. In FIG. 3, components that are the same as or equivalent to those of the present embodiment are assigned to the same reference signs as in FIGS. 1B and 2.

The phosphorescent member 2115 is arranged on a second area portion A22 of the cover 2011 other than a first area portion A21 of the cover 2011 that is located in such an emission direction of light from each of the light emitters 22 that a luminous intensity is equal to or greater than a preset standard luminous intensity that is less than a maximum luminous intensity. Regarding each light emitting element 22a, FIG. 3 illustrates: a virtual axis JP1 that is parallel to the thickness direction of the circuit board 21 and passes through the central portion of the light emitting element 22a; and a cone-shape region having the central portion of the light emitting element 22a as an apex and formed by a generatrix LM1 that is at an angle of $\theta_1$ to the virtual axis JP1, and, in this case, the first area portion A21 corresponds to an area of the cone-shaped region overlapping with the cover 2011.

Although a portion of the cover 11 is formed as the phosphorescent member in the lighting device 1 of the present embodiment, the present disclosure is not limited to the present embodiment. For example, the entirety of the cover may be formed to be long and may be made of a soft material that has translucency and that contains a phosphorescent material that is to be excited by light emitted by the light emitters 22. In this case, a content percentage of the luminous material contained in the cover may be set in such a manner that a transmittance at which the cover 11 transmits light emitted by the light emitters 22 is equal to or greater than a preset standard transmittance (for example, 50%).

Although the cover 11 is shaped like a square tube in the present embodiment, the present disclosure is not limited to the present embodiment, and the cover may have a cylindrical shape, a so-called dome-like shape obtained by cutting a cylinder along a plane parallel to the axis of the cylinder and having a curved lateral wall, or a shape having a cross-sectional surface the shape of which is different from the dome-like shape.

Although the cover 11 includes the phosphorescent member 115 including the first sub phosphorescent portion 151 and the second sub phosphorescent portion 152 in the present embodiment, the present disclosure is not limited to such a shape of the phosphorescent member, and, for example, the phosphorescent member may be shape like an elongated flat plate or long cylinder or have a shape having a cross-sectional surface the shape of which is different from the shapes like the elongated flat plate and the elongated cylinder.

Although the light emitting elements 22a are the LED elements in the present embodiment, the types of the light emitting elements 22a used in the present disclosure are not limited to the LED elements, and, for example, the light emitting elements 22a may be organic electroluminescence (EL) devices or inorganic EL devices.

Although the conductive wire 13 is pulled out from one end of the lighting device 1 in the longitudinal direction of the lighting device 1 in the present embodiment, the present disclosure is not limited to the present embodiment, and conductive wires may be pulled out from either end of the lighting device 1 in the longitudinal direction of the lighting device 1.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

INDUSTRIAL APPLICABILITY

The lighting device according to the present disclosure can be preferably used as lighting equipment for various facilities in which a direction indicator lamp must be installed.

What is claimed is:
1. A lighting device comprising:
a circuit board that is long and flexible;
light emitters mounted in a row on the circuit board; and
a cover that is long, the cover comprising
    a translucent member that is made of a translucent soft material and covers the circuit board and the light emitters, and
    a phosphorescent member containing a phosphorescent material that is to be excited by light emitted by the light emitters,
wherein
the cover has an elongated tubular shape,
the phosphorescent member is arranged on a second area portion of the cover other than a first area portion of the cover that is located in an emission direction of light from each of the light emitters, the emission direction being a direction in which a luminous intensity of light emitted from the first area portion is equal to or greater than a standard luminous intensity that is less than a preset maximum luminous intensity, the phosphorescent member comprises:
- a first sub phosphorescent portion having one end exposed to an inner space of the cover, the first sub phosphorescent portion extending toward an outer wall of the cover in a direction perpendicular to a thickness direction of the circuit board; and
- a second sub phosphorescent portion continuous with another end of the first sub phosphorescent portion, a width of the second sub phosphorescent portion in the thickness direction of the circuit board gradually increasing toward the outer wall of the cover, and a width of the first sub phosphorescent portion in a thickness direction of the circuit board is constant in a widthwise direction of the circuit board.

2. The lighting device according to claim 1, wherein the standard luminous intensity is equivalent to one-half of the maximum luminous intensity.

3. The lighting device according to any one of claim 2, wherein the phosphorescent member is arranged along the entirety of the cover in a longitudinal direction of the cover.

4. The lighting device according to any one of claim 1, wherein the phosphorescent member is arranged along the entirety of the cover in a longitudinal direction of the cover.

\* \* \* \* \*